United States Patent [19]
Nakanishi

[11] Patent Number: 5,726,726
[45] Date of Patent: Mar. 10, 1998

[54] LIQUID CRYSTAL DISPLAY AND METHOD OF PRODUCING THE SAME

[75] Inventor: Futoshi Nakanishi, Tokyo, Japan

[73] Assignee: NEC Corporation, Tokyo, Japan

[21] Appl. No.: 759,083

[22] Filed: Nov. 29, 1996

[30] Foreign Application Priority Data

Nov. 29, 1995  [JP]  Japan ................... 7-311312

[51] Int. Cl.⁶ ................................................. G20F 1/1345
[52] U.S. Cl. ........................... 349/149; 150/151; 150/152
[58] Field of Search ................................. 349/149–152

[56]  References Cited

U.S. PATENT DOCUMENTS

| | | | |
|---|---|---|---|
| 3,591,839 | 7/1971 | Evans | 317/234 |
| 4,283,118 | 8/1981 | Inoue | 349/151 |
| 4,336,551 | 6/1982 | Fujita et al. | 357/80 |
| 4,826,297 | 5/1989 | Kubo et al. | 349/151 |

FOREIGN PATENT DOCUMENTS 4-340928  11/1992  Japan .

*Primary Examiner*—William L. Sikes
*Assistant Examiner*—Julie Ngo
*Attorney, Agent, or Firm*—Sughrue, Mion, Zinn, Macpeak & Seas, PLLC

[57] ABSTRACT

A COG (Chip On Glass) type liquid crystal display (LCD) and a method of producing the same are disclosed. A semiconductor device is mounted on a glass substrate or LCD panel by a COG scheme. The semiconductor device has output connection terminals connected to an output conductive pattern formed on the glass substrate. Also, the semiconductor device has input connection terminals connected to a metal wiring included in a flexible printed circuit. This allows an input signal to be fed to the semiconductor device without resorting to an input conductive pattern customarily formed on the the glass substrate.

6 Claims, 2 Drawing Sheets

LIQUID CRYSTAL DISPLAY AND METHOD OF PRODUCING THE SAME

BACKGROUND OF THE INVENTION

The present invention relates to a liquid crystal display (LCD) and a method of producing the same and, more particularly, to a COG (Chip On Glass) type LCD and a method of producing the same.

A COG type LCD is disclosed in, e.g., Japanese Patent Laid-Open Publication No. 4-340928. The LCD taught in this document includes a glass substrate or LCD panel. An input conductive pattern and an output conductive pattern are formed on the glass substrate. Input connection terminals and output connection terminals are provided the input and output conductive patterns, respectively. A semiconductor device is adhered to the glass substrate via the input and output connection terminals. A flexible printed circuit (FPC) is connected to the input conductive pattern.

A problem with the above conventional LCD is that input signals cannot be stably fed to the semiconductor device because the input and output conductive patterns are implemented as thin films, i.e., the line resistance is high. Another problem is that because the input conductive pattern is formed in the peripheral region of the glass substrate, it increases the area necessary for the COG mounting of the semiconductor device to the substrate.

SUMMARY OF THE INVENTION

It is therefore an object of the present invention to provide an LCD capable of solving the problems particular to the conventional LCD described above, and a method of producing the same.

It is another object of the present invention to provide a miniature LCD and a method of producing the same In accordance with the present invention, a COG type LCD includes a glass substrate constituting an LCD panel. An output conductive pattern is formed on the glass substrate. Output connection terminals are provided on the glass substrate and connected to the output conductive pattern. Input connection terminals are provided on the glass substrate. An FPC is provided on the glass substrate via a metal wiring. The metal wiring is connected to the input connection terminals with its end protruding from the FPC.

Also, in accordance with the present invention, a method of producing an LCD has the steps of connecting, on a glass substrate constituting an LCD panel, the end portion of an FPC where a metal wiring is exposed to input connection terminals of a semiconductor device with adhesive for thereby affixing the former to the latter with adhesive, and connecting an output conductive pattern formed on the glass substrate to output connection terminals of the semiconductor device, and affixing the former to the latter with the adhesive.

BRIEF DESCRIPTION OF THE DRAWINGS

The above and other objects, features and advantages of the present invention will become apparent from the following detailed description taken with the accompanying drawings in which.

In the figures, identical reference numerals designate identical structural elements.

DESCRIPTION OF THE PREFERRED EMBODIMENTS

Figure 1:
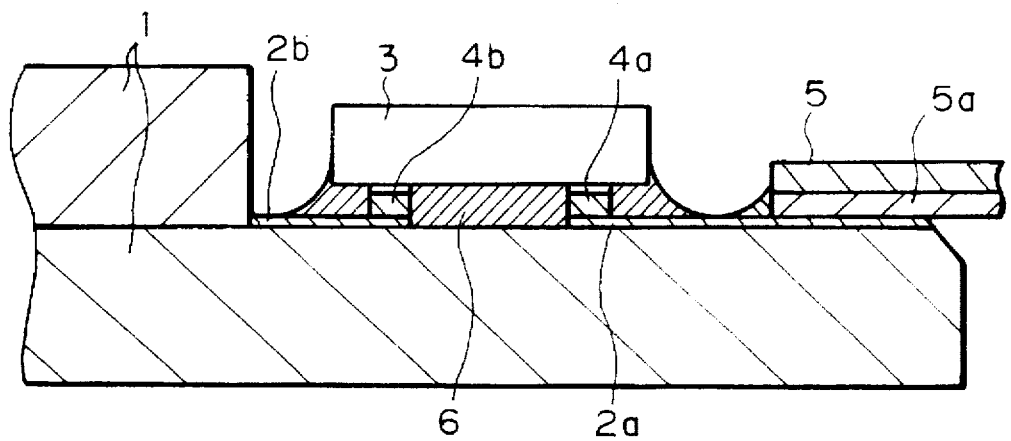
FIG. 1 is a section showing a conventional COG type LCD.

To better understand the present invention, a brief reference will be made to a conventional COG type LCD, particularly the LCD taught in previously mentioned Japanese Patent Laid-Open Publication No. 4-340928, shown in FIG. 1. As shown, the LCD has a glass substrate or LCD panel. An input conductive pattern 2a and an output conductive pattern 2b are formed on the glass substrate 1. Input connection terminals 4a and output connection terminals 4b are provided on the conductive patterns 2a and 2b, respectively. A semiconductor device 3 is affixed to the substrate 1 by adhesive 6 via the terminals 4a and 4b. An FPC 5 is connected to the input conductive pattern 2a. The FPC 5 is connected to the input connection terminals 4a via a metal wiring 5a and the input conductive pattern 2a. This kind of LCD configuration has some problems yet to be solved, as discussed earlier.

Figure 2:
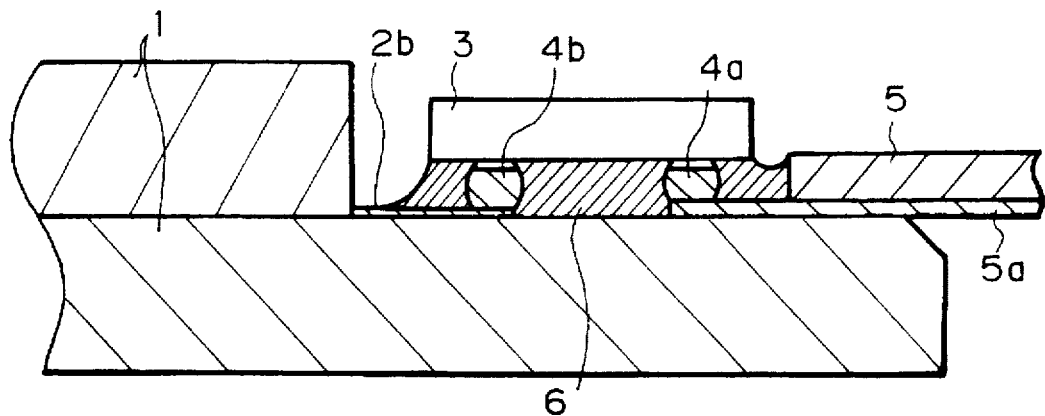
FIG. 2 is a section showing a COG type LCD embodying the present invention.

Referring to FIG. 2, an LCD embodying the present invention is shown. As shown, the LCD includes a semiconductor device 3 having input connection terminals 4a and output connection terminals 4b. In the illustrative embodiment, the terminals 4a and 4b are metal terminals formed by gold wire bonding. An FPC 5 has a metal wiring 5a aligned with the input connection terminal 4a of the semiconductor device 3. An output conductive pattern 2b is formed on a glass substrate 1 and aligned with the output connection terminals 4b of the semiconductor device 3. The metal wiring 5a is implemented by 18 μm thick copper foil provided on a polyimide substrate. The connection terminals 4a and 4b each has a height greater than 80 μm. In this condition, the metal wiring 5a is pressed and buried by the input terminals 4a formed of gold while the terminals 4a themselves are pressured and deformed. As a result, the difference in height of 18 μm is absorbed. Subsequently, both the semiconductor device 3 and FPC 5 are affixed to the glass substrate 1 by adhesive 6 and stably connected together thereby.

An alternative embodiment of the present invention will be described with reference to FIG. 3. As shown, the semiconductor device 3 is implemented as one for a tape carrier package (TCP). The input and output connection terminals 4a and 4b of the semiconductor device 3 are gold terminals formed by plating, and have substantially identical dimensions. As for height, the connection terminals 4a and 4b are 20 μm each. Second connection terminals 7 are each formed on the respective output connection terminal 4b by thermocompression, e.g., gold wire ball bonding. The second connection terminals 7 each has the same thickness as the metal wiring 5a of the FPC 5. As a result, the semiconductor device 3 is provided with a two-step output connection terminals greater in height than the input connection terminals 4a. In this configuration, when the terminals 4a are connected to the metal wiring 5a, the terminals 7 fill the resulting gaps between the terminals 4b and the output conductive pattern 2b formed on the glass substrate 1. This insures the stable electrical connection of the structural elements.

Figure 3:
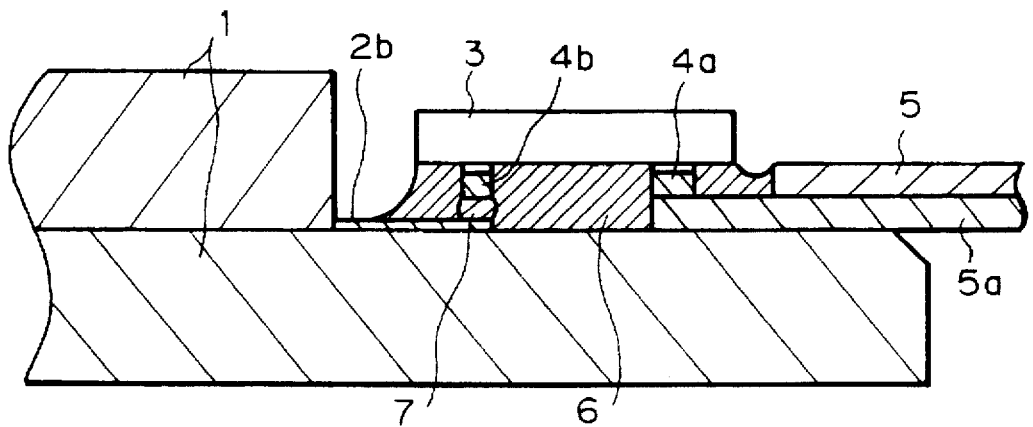
FIG. 3 is a section showing an alternative embodiment of the present invention.
Figure 4A:
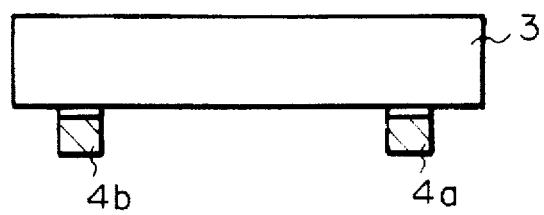
FIGS. 4A–4C are sections demonstrating a method of producing the LCD shown in FIG. 3.
Figure 4B:
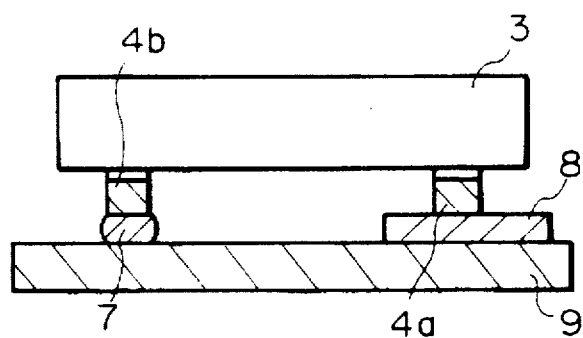
Figure 4C:
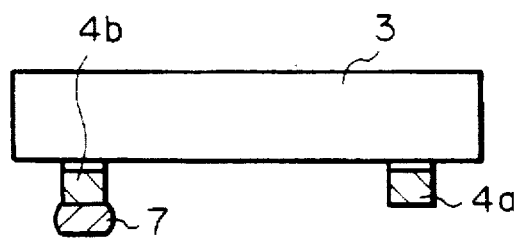

FIGS. 4A–4C demonstrate a procedure for producing the LCD shown in FIG. 3. First, as shown in FIG. 4A, the semiconductor device 3 with the input and output connection terminals 4a and 4b are prepared. As shown in FIG. 4B, gold balls which will turn out the second connection terminals 7 are arranged on a flat ceramic sheet 9 at the same pitch as the terminals 4b. In this condition, the semiconductor device 3 is heated and pressed face down with the result that the second connection terminals 7 are transferred to the output connection terminals 4b by thermocompression, as shown in FIG. 4C. At this instant, a sheet 8 for height adjustment is disposed between the input terminals 4a and the ceramic sheet 9.

Figure 5A:
FIGS. 5A and 5B are sections showing an alternative method of producing the LCD shown in FIG. 3.
Figure 5B:
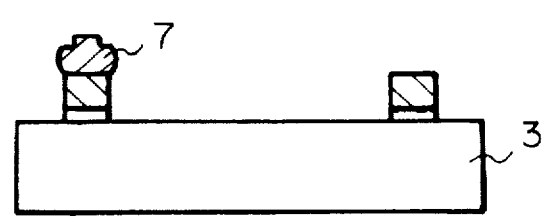

FIGS. 5A and 5B show an alternative procedure for producing the LCD shown in FIG. 4. As shown in FIG. 5A, the input and output connection terminals 4a and 4b are arranged on the semiconductor device 3. As shown in FIG. 5B, if the pitch of the input connection terminals 4b is 120 μm or above, a tool 10 for wire ball bonding is usable to form the second connection terminals 7 directly on the output connection terminals 4b. The input and output connection terminals 4a and 4b are 20 μm high each. Assume that the metal wiring 5a is 18 μm thick, and that the second connection terminals 7 formed by wire ball bonding are 25 μm high each. Then, the total height of each output connection terminal 4b and associated second connection terminal 7 is 45 μm. On the other hand, the total height of each input connection terminal 4a and metal wiring 5a is 38 μm. The difference of 7 μm between the input side and the output side is successfully absorbed because the second terminal 7 is collapsed. Consequently, the semiconductor device 3 becomes horizontal relative to the glass substrate or LCD panel 1 and remains horizontal stably. Likewise, assume that the metal wiring 5a is 35 μm thick, and that the second connection terminals 7 are 47 μm high each. Then, the output side has a total height of 67 μm while the input side has a total height of 55 μm. This difference in height is also absorbed because the second terminal 7 is collapsed by about 12 μm.

In summary, it will be seen that the present invention provides an LCD and a method producing the same which have various unprecedented advantages, as follows. Signals are fed to a semiconductor device via the metal wiring of an FPC having low resistance. This insures stable signal feed to a COG type semiconductor device and therefore realizes high quality image display with ease. Moreover, the present invention eliminates the need for a conductive pattern customarily provided on a glass substrate for feeding an input signal, and thereby saves space. This reduces the size of the glass substrate and therefore the overall size of the LCD.

Various modifications will become possible for those skilled in the art after receiving the teachings of the present disclosure without departing from the scope thereof.

What is claimed is:

1. A COG (Chip On Glass) type liquid crystal display (LCD) comprising:

a glass substrate constituting an LCD panel;

an output conductive pattern formed on said glass substrate;

output connection terminals provided on said glass substrate and connected to said output conductive pattern;

input connection terminals provided on said glass substrate; and a flexible printed circuit (FPC) provided on said glass substrate via a metal wiring;

wherein said metal wiring is connected to said input connection terminals with an end thereof protruding from said FPC.

2. An LCD as claimed in claim 1, wherein said input connection terminals and said output connection terminals are different in height from each other.

3. An LCD as claimed in claim 1, wherein said input connection terminals and said output connection terminals are substantially identical in height with each other.

4. An LCD as claimed in claim 3, further comprising second connection terminals each being added to the respective output connection terminal.

5. A method of producing an LCD, comprising the steps of:

(a) connecting, on a glass substrate constituting an LCD panel, an end portion of an FPC where a metal wiring is exposed to input connection terminals of a semiconductor device with adhesive for thereby affixing said end portion to said input connection terminals; and (b) connecting an output conductive pattern formed on said glass substrate to output connection terminals of said semiconductor device, and affixing said output conductive pattern to said output connection terminals with the adhesive.

6. A method as claimed in claim 5, wherein steps (a) and (b) are executed at the same time.

* * * * *